United States Patent
Lu et al.

(10) Patent No.: US 8,058,897 B1
(45) Date of Patent: Nov. 15, 2011

(54) CONFIGURATION OF A MULTI-DIE INTEGRATED CIRCUIT

(75) Inventors: Weiguang Lu, San Jose, CA (US); Eric E. Edwards, Albuquerque, NM (US); Paul-Hugo Lamarche, San Jose, CA (US); Steven P. Young, Boulder, CO (US); Brian C. Gaide, Glassboro, NJ (US); Joe Eddie Leyba, II, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/825,286

(22) Filed: Jun. 28, 2010

(51) Int. Cl.
*H03K 19/173* (2006.01)
*H01L 25/00* (2006.01)

(52) U.S. Cl. .............. 326/38; 326/37; 326/41; 326/47; 326/101

(58) Field of Classification Search .............. 326/37–41, 326/47, 101
See application file for complete search history.

(56) References Cited

U.S. PATENT DOCUMENTS

| | | | |
|---|---|---|---|
| 6,614,259 B2 * | 9/2003 | Couts-Martin et al. | 326/40 |
| 2003/0160633 A1 * | 8/2003 | Terrill et al. | 326/39 |
| 2009/0160482 A1 | 6/2009 | Karp et al. | |
| 2009/0161401 A1 * | 6/2009 | Bilger et al. | 365/51 |
| 2010/0157854 A1 | 6/2010 | Anderson et al. | |

OTHER PUBLICATIONS

Xilinx, Inc. "Virtex-6 FPGA Configuration User Guide", UG360 (v2.0) Nov. 15, 2009, pp. 145-156, Chapter 10, www.xilinx.com, Xilinx, Inc., 2100 Logic Drive, San Jose, CA 95124 US.
U.S. Appl. No. 12/820,591, filed Jun. 22, 2010, Weiguang Lu et al.

\* cited by examiner

*Primary Examiner* — Shawki S Ismail
*Assistant Examiner* — Thienvu Tran
(74) *Attorney, Agent, or Firm* — Kevin T. Cuenot; Thomas George

(57) ABSTRACT

A method of configuring an integrated circuit (IC) can include receiving configuration data within a master die of the IC. The IC can include the master die and a slave die. A master segment and a slave segment of the configuration data can be determined. The slave segment of the configuration data can be distributed to the slave die of the IC.

14 Claims, 6 Drawing Sheets

US 8,058,897 B1

CONFIGURATION OF A MULTI-DIE INTEGRATED CIRCUIT

FIELD OF THE INVENTION

One or more embodiments disclosed within this specification relate to integrated circuits (ICs). More particularly, one or more embodiments relate to configuration of an IC that includes multiple dies.

BACKGROUND

Programmable integrated circuits (ICs) are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

SUMMARY

One or more embodiments disclosed within this specification relate to integrated circuits (ICs) and, more particularly, to configuration of an IC that includes multiple dies. One or more embodiments can include a method of configuring an IC. Configuration data can be received within a master die of the IC. The IC can include the master die and a slave die. A master segment and a slave segment of the configuration data can be determined. The slave segment of the configuration data can be distributed to the slave die of the IC.

One or more embodiments can include an IC. The IC can include an interposer having a configuration bus. The IC also can include a first die on a surface of the interposer and a second die on the surface of the interposer. The first die and the second die can be coupled by the configuration bus. The first die can, responsive to receiving configuration data, determine a first segment and a second segment of the configuration data and distribute the second segment of the configuration data to the second die through the configuration bus.

One or more embodiments can include an IC having an interposer. The IC can include a first die on a surface of the interposer and a second die also on the surface of the interposer. The first die can generate a global signal propagated through the interposer. The second die can be coupled to the global signal. The first die and the second die can be configured to implement a same operating state concurrently responsive to the global signal.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to configuration of an IC that includes multiple dies. An IC that is formed of two or more dies can be referred to as a "multi-die IC." In accordance with the one or more embodiments disclosed within this specification, the individual dies of the multi-die IC can be configured through an internal configuration bus. The particular tasks performed by each die can be determined, at least in part, according to whether the die is designated as a master die or a slave die. Cooperation among the various dies of the multi-die IC can be coordinated through one or more global signals distributed through the multi-die IC that ensure uniformity of operating state among the dies of the multi-die IC.

Figure 1:
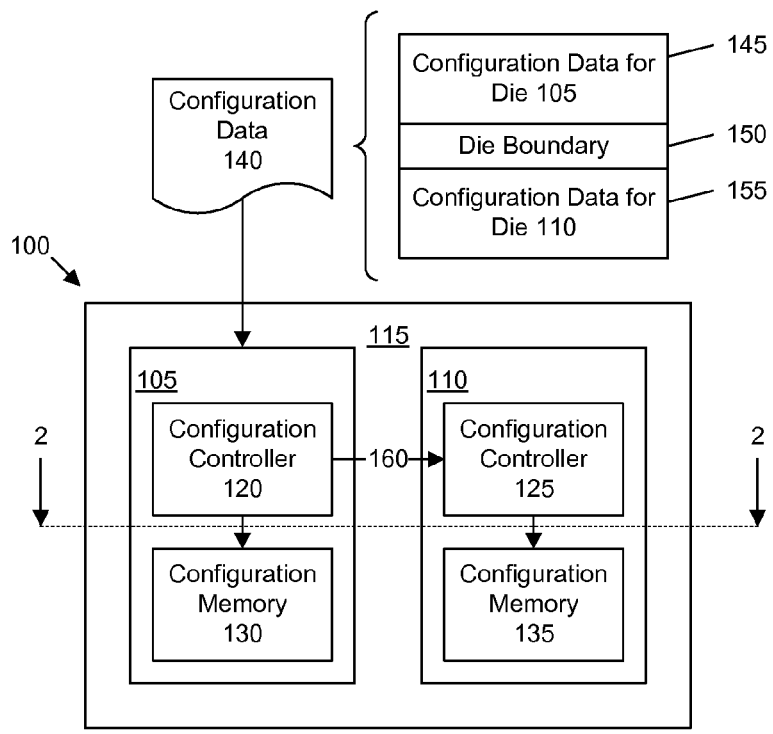
FIG. 1 is a first block diagram illustrating a multi-die IC in accordance with one or more embodiments disclosed within this specification.

FIG. 1 is a first block diagram illustrating a multi-die IC 100 in accordance with one or more embodiments disclosed within this specification. As shown, multi-die IC 100 can include die 105 and die 110 on a surface of an interposer 115, e.g., on a top surface or on a bottom surface. The term "on," as used within this specification and the claims, includes when die 105 and die 110 are in direct physical contact with interposer 115 or are indirectly coupled through one or more intervening IC process layers that can include one or more circuit structures. In one or more embodiments, each of dies 105 and 110 can implement a programmable IC such as a field programmable gate array (FPGA).

Interposer 115 can communicatively link die 105 and die 110 by coupling selected pads of die 105 with selected pads of die 110. In general, a connection between die 105 and die 110, in this case facilitated by interposer 115, can be referred to as an inter-die connection or an inter-die signal. An inter-die connection or signal refers to a signal path that begins in a first die and traverses a boundary between the first die and a second die, e.g., a die-to-die connection through an inter-die wire (not shown).

In one or more embodiments, interposer 115 can include a configuration bus 160. The configuration bus 160 can be a bidirectional bus through which configuration data can be exchanged between dies 105 and 110. The configuration bus 160 can be formed of one or more inter-die wires that are reserved solely for use in conveying configuration data and, as such, are not available for use in implementing user circuit designs. For purposes of illustration, only two dies are shown in FIG. 1. The one or more embodiments described within this specification, however, are not intended to be limited by the number of dies disposed upon interposer 115. For example, three or more dies can be disposed on top of interposer 115.

As shown, die 105 can include a configuration controller 120 and configuration memory 130. Die 110 also can include a configuration controller 125 and configuration memory 135. Each of configuration controllers 120 and 125 can perform configuration operations for dies 105 and 110 respectively. For example, responsive to receiving configuration data, e.g., configuration data 140, configuration controller 120 can load segment 145 of configuration data 140, i.e., configuration data for die 105, into configuration memory 130. Configuration controller 125 can receive segment 155 from configuration controller 120 via configuration bus 160, as will be described within this specification in greater detail. Accordingly, configuration controller 125 can load segment 155 of configuration data 140, i.e., configuration data for die 110, into configuration memory 135. Loading configuration data into configuration memory of a die effectively configures the die with a particular circuit design. In this regard, loading configuration data into configuration memory of a die can be said to "instantiate" a circuit design specified by the configuration data within the die.

In general, within multi-die IC 100, one die such as die 105 can be designated as the master die and the other dies, e.g., die 110, can be designated as the slave die. For purposes of configuration and selected other functions, the master die can be tasked with interacting with systems external to multi-die IC 100. Thus, from outside of multi-die IC 100, it appears as though one is interacting with a single die. The various connection issues relating to configuration of multiple, single die ICs when implementing a system, e.g., on a printed circuit board, that must be resolved manually by a system designer are resolved within multi-die IC 100 internally as described in further detail within this specification. The inter-die connectivity described within this specification does not require any configuration or layout design from a user such as a circuit and/or system designer.

In illustration, configuration data 140 can be loaded into multi-die IC 100. Configuration data 140, though including segments for each of dies 105 and 110, can be loaded into die 105, being the master die. Configuration controller 120 can analyze configuration data 140 and identify die boundary 150. Die boundary 150 can be an identifier, e.g., a predetermined bit pattern, indicating that the segment to follow is configuration data for a different die of the same multi-die IC. Thus, configuration controller 120, responsive to detecting die boundary 150, can send segment 155 through configuration bus 160 to die 110.

Die boundary 150, for example, can be a command that is interpreted and/or executed by configuration controller 120. One or more additional commands (not shown) can be included within configuration data 140 that, when executed by configuration controller 120 and/or configuration controller 125, instruct each respective configuration controller how to process received configuration data or portions, e.g., segments, thereof. For example, an additional command can be included within configuration data preceding segment 145 instructing configuration controller 120 that segment 145 is to be loaded into configuration memory 130. Die boundary 150 can instruct configuration controller 120 to send segment 155 to slave die 110. Die boundary 150, or one or more other commands preceding segment 155 or included within segment 155 can instruct configuration controller 125 to load segment 155 within configuration memory 130. In this regard, the various actions described within this specification can be performed responsive to detecting and/or executing the commands or other information determined or identified from within received configuration data.

In one or more embodiments, die boundary 150 can specify a length. Accordingly, die 105 can determine that the configuration data following die boundary 150, up to the specified length, is a segment of configuration data for a slave die, e.g., die 110. Thus, die 105, and more particularly, configuration controller 120, can forward segment 155, knowing the length of segment 155 from die boundary 150, to die 110. Specifying the length of a segment of configuration data within die boundary 150 allows configuration data for additional dies, e.g., three or four, to be included within configuration data 140 when multi-die IC 100 includes more than two dies. When more than two dies are included, for example, an additional or second die boundary can be appended to the configuration data following segment 155. An additional segment then can be appended following the second die boundary, etc. Accordingly, configuration data for different dies of a multi-die IC can be encapsulated as segments using an encapsulation mechanism, e.g., die boundary 150 and/or other commands, embedded within the configuration data.

Figure 2:
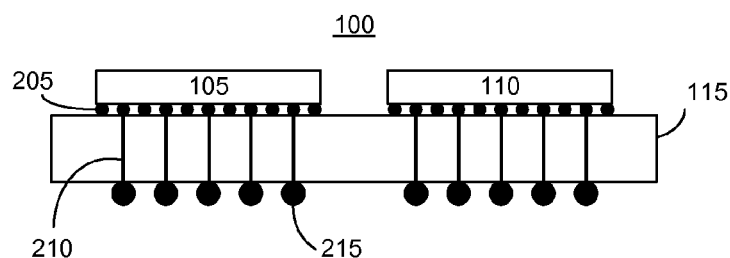
FIG. 2 is a first cross-sectional side view of a multi-die IC in accordance with one or more other embodiments disclosed within this specification.

FIG. 2 is a first cross-sectional side view of a multi-die IC in accordance with one or more other embodiments disclosed within this specification. FIG. 2 illustrates multi-die IC 100 of FIG. 1, in cross-section, taken along cut-line 2 of FIG. 1. Accordingly, like numbers will be used to refer to the same items throughout this specification to the extent possible.

Interposer 115 can be implemented as a die formed of one or more layers of an IC process technology. Interposer 115 can include at least one metallization layer, but can include a plurality of metallization layers separated by appropriate insulating or non-conductive layers. The metallization layer or layers, as the case may be, implements a plurality of inter-die wires (not shown) that couple selected pads of die 105 to selected pads of die 110.

In one or more embodiments, interposer 115 can be configured as an entirely passive structure within which the inter-die wires are implemented. In one or more other embodiments, interposer 115 can include one or more active devices and, thus, be considered an active structure. The one or more embodiments described within this specification are not intended to be limited to either passive or active interposers.

In general, die 105 and die 110 are disposed in a same horizontal plane on top of interposer 115. Die 105 and die 110 can be coupled to interposer 115 through a plurality of micro bumps 205. Micro bumps 205 generally are solder balls that electrically couple pads (not shown) of each of dies 105 and 110 to pads (not shown) of interposer 115. For example, during manufacture of multi-die IC 100, the bottom of die 105 and the bottom of die 110 can be micro-bumped. Similarly, the top of interposer 115 can be micro-bumped. Die 105 and die 110 can be aligned on the top of interposer 115 so that each micro-bump of dies 105 and 110 is aligned with a micro-bump on interposer 115. Aligned micro-bump pairs between interposer 115 and dies 105 and 110, can, through an IC manufacturing process, be merged to form a single electrical connection illustrated as micro-bumps 205.

In one or more embodiments, one or more micro-bumps 205 can be used to specify aspects of multi-die IC 100 such as the number of dies included within multi-die IC 100 and which die is designated as the master die and which die (or dies) is designated as the slave die. For example, during the manufacturing process, one or more of micro-bumps 205 for each of dies 105 and 110 can be reserved to specify the information noted. The reserved micro-bumps 205, e.g., each individual one of the reserved micro-bumps 205, can be either coupled to ground or left floating. When coupled to ground, the reserved micro-bumps 205 remain at the voltage potential of ground, e.g., a logic low. When the reserved micro-bumps 205 are left floating, pull-up circuitry coupled to the reserved micro-bumps 205 can pull the voltage high, e.g., indicating a logic high.

One reserved micro-bump 205 can be used to indicate whether the die is a master or a slave. A controller or other circuitry, e.g., a configuration controller, within each die can determine whether that die is a master or a slave based upon whether the enumerated and reserved micro-bump 205 of that die is high or low. In this manner, the designation of one die as master and each other die as a slave can be implemented during the manufacturing process through proper coding, e.g., coupling of the reserved micro-bumps 205 in each respective die. This process allows identical dies to be included within multi-die IC 100 since designation of one die as master and another die as slave can occur during packaging purely through the encoding described as opposed to when each die is manufactured. The micro-bump encoding process means that master dies can be identical to slave dies when manufactured.

Other ones of the reserved micro-bumps 205 can be used to specify a code indicating the number of dies included in multi-die IC 100. The code can be matched with a code in any configuration data that is received by multi-die IC 100. For example, the configuration data can specify a like or same code so that the configuration controller within the die designated as master can ensure that the incoming configuration data includes a code matching the code enumerated through reserved micro-bumps 205 as described. A match between the code in the configuration data and the code enumerated through reserved micro-bumps 205 means that the incoming configuration data includes the correct number of segments, i.e., one segment for each die included in multi-die IC 100.

Some pads of interposer 115 coupled to micro bumps 205 can couple to through silicon vias (TSVs) 210. Each TSV 210 can extend completely through interposer 115 extending from a pad disposed immediately below the top surface of interposer 115 through to a pad exposed through the bottom surface of interposer 115. Each TSV 210 can couple a pad of one of dies 105 or 110, via a micro-bump 205, for example, to one of the plurality of package bumps 215.

Package bumps 215, also referred to as "C4 bumps," generally are solder balls that couple pads on the bottom portion of interposer 115 to the package of multi-die IC 100, and thus, to external pins of the package. Accordingly, one or more pads of die 105 and one or more pads of die 110 can be coupled to external pins of the package of multi-die IC 100 by coupling the pads to micro bumps 205, to TSVs 210, to package bumps 215, and to external package pins.

Figure 3:
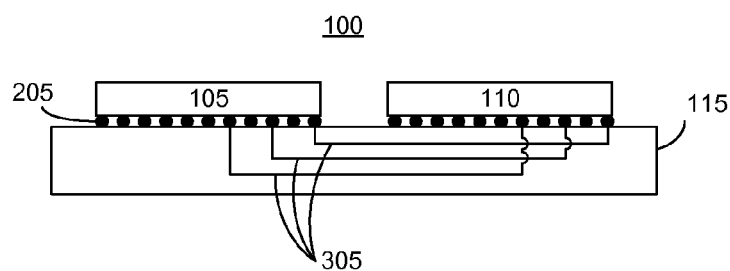
FIG. 3 is a second cross-sectional side view of a multi-die IC in accordance with one or more other embodiments disclosed within this specification.

FIG. 3 is a second cross-sectional side view of a multi-die IC in accordance with one or more other embodiments disclosed within this specification. FIG. 3 illustrates another exemplary implementation of multi-die IC 100 of FIG. 1, in cross-section, taken along cut-line 2 of FIG. 1. For purposes of illustration, TSVs and package bumps illustrated in FIG. 2 are not shown to more clearly illustrate inter-die wires 305 disposed within interposer 115.

Referring to FIG. 3, interposer 115 includes a plurality of inter-die wires 305. Some pads of interposer 115 coupled to micro bumps 205 can couple to inter-die wires 305. Each of inter-die wires 305 is effectively a long interconnect line within interposer 115 that couples die 105 to die 110. For example, each of inter-die wires 305 can couple a pad of die 105 to a pad of die 110. As shown, inter-die wires 305 can be disposed beneath the top surface, e.g., within, interposer 115.

Inter-die wires 305, for example, can be used to implement configuration bus 160 described with reference to FIG. 1. When a multi-die IC has three or more dies, some inter-die wires 305 can couple dies that are immediately adjacent to one another. Other inter-die wires 305, however, can be used to couple a plurality of dies, e.g., three or more, in parallel. Accordingly, within a multi-die IC having three or more dies, signals can be sent from one die to another serially, e.g., in a daisy chain manner, or in parallel, e.g., broadcast, to more than one die concurrently or simultaneously.

As noted, in one or more other embodiments, interposer 115 can include active circuitry. In some cases, the active circuitry can include one or more transistors or other switches. In other cases, however, the active circuitry can implement another programmable IC or portion of a programmable IC. For example, interposer 115 can include active circuitry that is configurable in substantially the same way that circuitry within each of dies 105 and 110 is configurable. Accordingly, though not illustrated, interposer 115 can include configurable circuitry, a configuration controller, and configuration memory. In that case, the configuration controller implemented within interposer 115 can be coupled to configuration bus 160. Accordingly, configuration data loaded into multi-die IC 100 can include a segment of configuration data that is provided to the configuration controller within interposer 115. The configuration controller within interposer 115 can load the segment of configuration data into the configuration memory of interposer 115 thereby instantiating a circuit design within the configurable circuitry of interposer 115.

Figure 4:
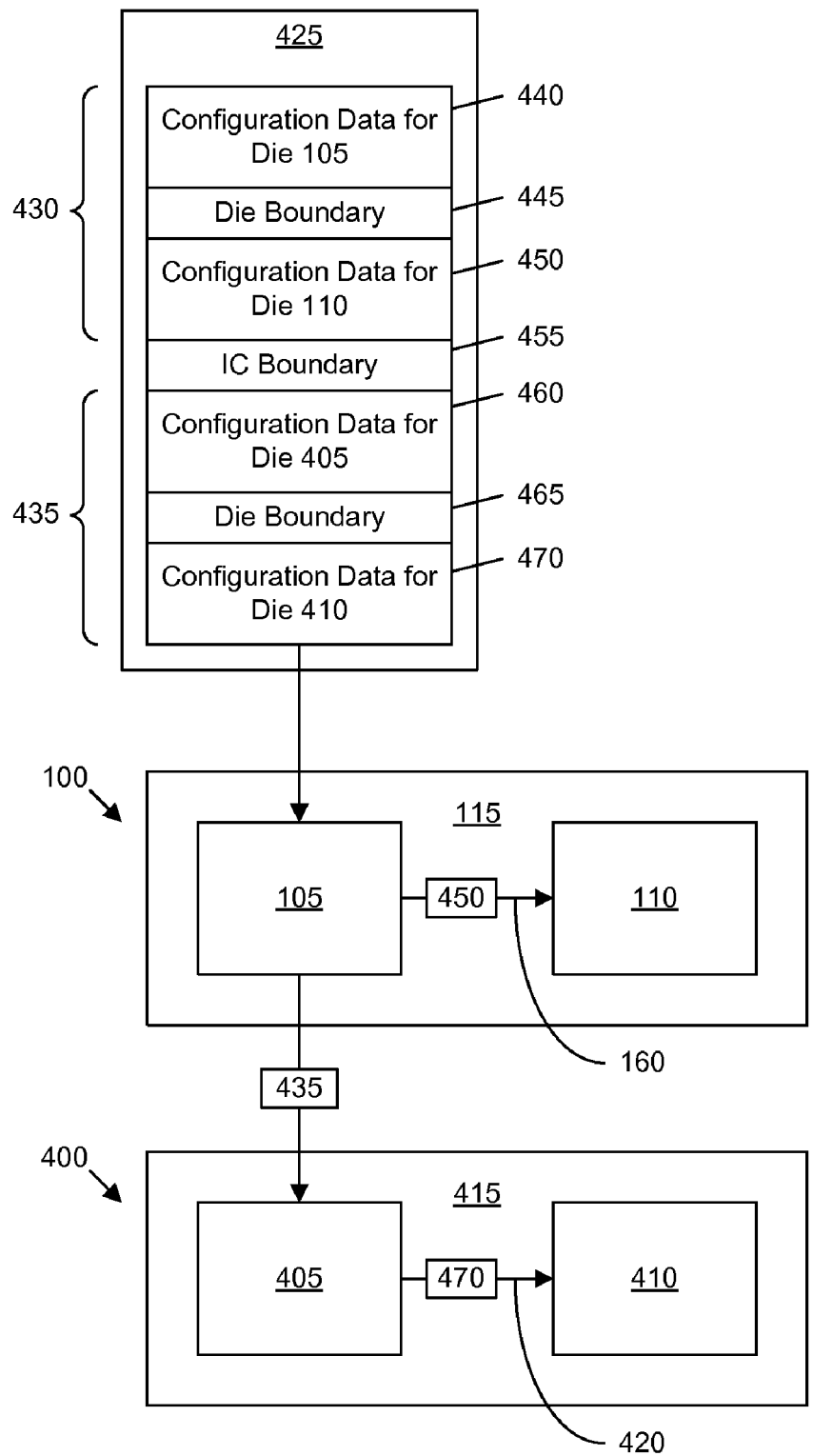
FIG. 4 is a second block diagram illustrating a system incorporating a plurality of multi-die ICs in accordance with one or more other embodiments disclosed within this specification.

FIG. 4 is a second block diagram illustrating a system incorporating a plurality of multi-die ICs in accordance with one or more other embodiments disclosed within this specification. FIG. 4 illustrates a technique for configuring two or more multi-die ICs. As shown, multi-die IC 100 can be daisy chained with a multi-die IC 400. For example, multi-die ICs 100 and 400 can be located on a printed circuit board or coupled within a system through other electrical connections. As described, multi-die IC 100 can include die 105 (the master) and die 110 (the slave), each disposed on interposer 115. Die 105 and die 110 can be coupled, at least for purposes of configuration, through configuration bus 160. Similarly, multi-die IC 400 can include die 405 (the master) and die 410 (the slave) disposed on an interposer 415. Die 405 and die 410 can be coupled, at least for purposes of configuration, via configuration bus 420. For ease of illustration, the configuration controller within each die has been excluded.

As shown, configuration data 425 can be loaded into multi-die IC 100 and, more specifically, into master die 105. Configuration data 425 includes a plurality of segments of configuration data, e.g., one segment for each die to be programmed within both multi-die IC 100 and multi-die IC 400. In general, configuration data 425 can include two portions 430 and 435. Portion 430 includes the segments needed to program dies 105 and 110 of multi-die IC 100. Portion 435 includes the segments needed to program dies 405 and 410 of multi-die IC 400. As shown, portion 430 is separated from portion 435 by IC boundary 455. IC boundary 455, like the die boundary described with reference to FIG. 1, can specify a predetermined bit pattern indicating the size of the portion, i.e., portion 435, of configuration data 425 following die boundary 455 that pertains to another IC, e.g., in this case multi-die IC 400.

Segment 440 is the configuration data for master die 105. Master die 105 can retain segment 440 for loading into the configuration memory of master die 105. Segment 450, which is separated from segment 440 by die boundary 445, is the configuration data for slave die 110. As noted, master die 105, and more particularly the configuration controller within master die 105, can identify die boundary 445 and, in response, send segment 450 to slave die 110 via configuration bus 160. In continuing to analyze configuration data 425, master die 105 further can detect IC boundary 455. IC boundary 455 can be another example of a command as previously described to be interpreted and/or executed to direct processing of configuration data as described herein. Accordingly, master die 105 can send portion 435 to multi-die IC 400 and, more particularly, to master die 405. Implementation of die boundary 445 and die boundary 465, for example, facilitate usage of IC boundary 455 to daisy chain multi-die IC 100 and multi-die IC 400 as shown.

Master die 405 can receive portion 435 from master die 105. Segment 460 is the configuration data for master die 405. Master die 405 can retain segment 460 for loading into the configuration memory of master die 405. Segment 470, which is separated from segment 460 by die boundary 465, is the configuration data for slave die 410. As noted, master die 405, and more particularly the configuration controller within master die 405, can identify die boundary 465 and, in response, send segment 470 to slave die 410 via configuration bus 420.

Figure 5:
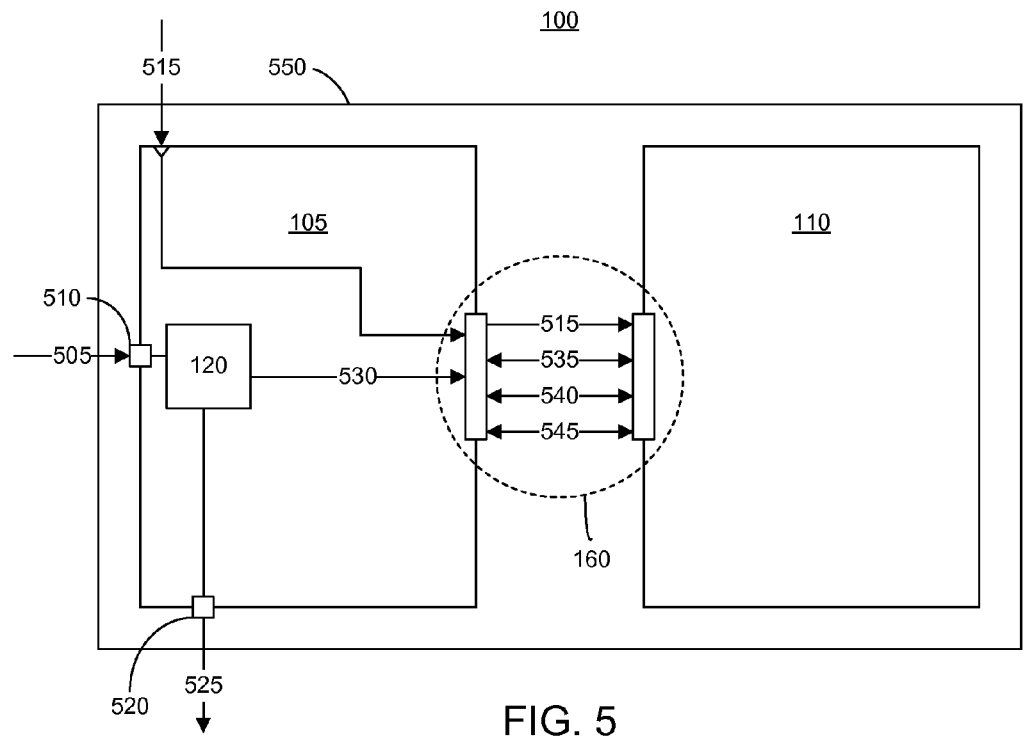
FIG. 5 is a third block diagram illustrating a multi-die IC in accordance with one or more other embodiments disclosed within this specification.

FIG. 5 is a third block diagram illustrating a multi-die IC in accordance with one or more other embodiments disclosed within this specification. FIG. 5 illustrates configuration bus 160, as described with reference to FIG. 1, of multi-die IC 100 in greater detail. For purposes of illustration, the interposer has been abstracted away leaving only inter-die wires implementing various signals. It should be appreciated, however, that configuration bus 160 is formed of a plurality of inter-die wires residing within the interposer. Block 550 is included to indicate the boundary of multi-die IC 100. For example, block 550 can illustrate the package boundary with signals entering or leaving block 550 indicating signals entering or leaving external pins of the multi-die IC 100 package.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two or more components connected by a signal or wire as the case may be.

As shown, master die 105 can receive configuration data via signal 505 through an input port 510. In one or more embodiments, input port 510 can be a dedicated configuration input port. Input port 510 can be coupled to input/output (I/O) pins of the packaging of multi-die IC 100. Accordingly, configuration data specified by signal 505 can be received from a source external to multi-die IC 100. Similarly, a clock signal 515 can be received from a source external to multi-die IC 100. Using configuration controller 120, different segments of configuration data received via signal 505 can be routed to slave die 110 through configuration bus 160 and/or output from a master die configuration output port 520. Master die configuration output port 520, like input port 510, can be coupled to one or more external pins of the package of multi-die IC 100. Signal 525 from master die configuration output port 520 can specify configuration data that is being provided to another multi-die IC as illustrated with reference to FIG. 4, for example.

As discussed, master die 105 can send configuration data to master die configuration output port 520. Master die configuration output port 520 can be coupled to a configuration data input port or another input port of a next multi-die IC daisy chained with multi-die IC 100. In one or more embodiments, master die 105 can send a token to a next multi-die in a serial and/or daisy chain type of configuration, e.g., as illustrated with reference to FIG. 4, through master die configuration output port 520. The token sent from master die 105 and output from master die configuration output port 520 can be received via an input port of the daisy chained multi-die IC. When received, the token can instruct the daisy chained multi-die IC to listen to the, e.g., its, configuration data input port. For example, referring to FIG. 4, multi-die IC 100 can forward a token to multi-die IC 400 instructing multi-die 400 to listen to the configuration data input port of multi-die IC 400. The configuration data input port of the daisy chained multi-die IC can be coupled to the same input signal as the input port of multi-die IC 100, i.e., in this case signal 505.

Turning to configuration bus 160, as shown, clock signal 515 can be propagated through configuration bus 160 to slave die 110. Signal 530 can specify configuration data sent from configuration controller 120 to be distributed to slave die 110. Signal 530 further can specify control signals for controlling and/or administering configuration bus 160. Signal 535 of configuration bus 160 can represent a plurality of bi-directional data lines. In one or more embodiments, signal 535 can represent a bi-directional 32-bit data channel.

Signal 540 can be a read/write signal that either master die 105 or slave die 110 can exert to take control of configuration bus 160. Thus, signal 540 specifies which die is the "master" with regard to configuration bus 160 (in contrast to being the master die within multi-die IC 100). Signal 545 can be used to pass a token or other value that indicates the destination of the data that is being placed on configuration bus 160. The token, for example, can indicate that data placed on signal 535 by master die 105 is destined for slave die 110 or another specific slave die when multi-die IC 100 includes more than one slave die. In another example, the token can indicate that data placed on configuration bus 160 and, in particular signal 535, by slave die 110 is destined for master die 105. Signal 545 takes on increasing significance in cases where two or more slave dies are included within multi-die IC 100.

Figure 6:
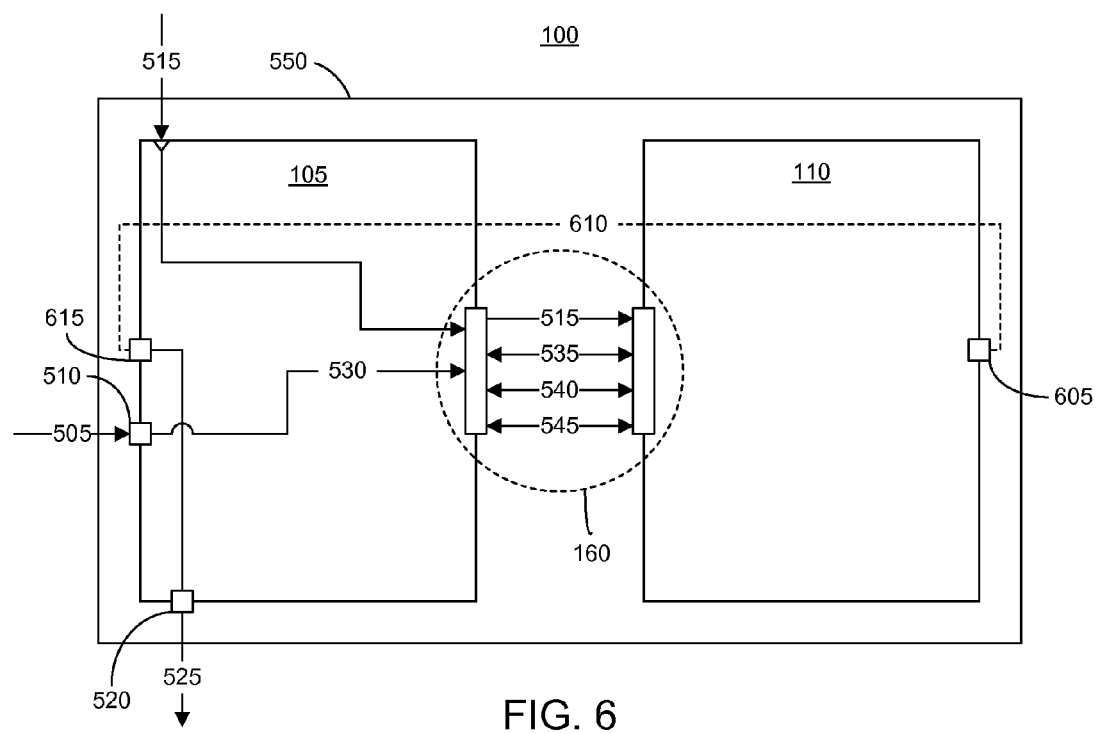
FIG. 6 is a fourth block diagram illustrating a multi-die IC in accordance with one or more other embodiments disclosed within this specification.

FIG. 6 is a fourth block diagram illustrating a multi-die IC in accordance with one or more other embodiments disclosed within this specification. FIG. 6 illustrates an alternative configuration of multi-die IC 100. As shown in FIG. 6, slave die 110 can include an output port 605 through which signal 610 is output back to master die 105. Master die 105 receives signal 610 through input port 615. Both output port 605 and input port 615 are internal ports in that neither is bonded out or otherwise coupled to external pins of the package of multi-die IC 100. Thus, each is maintained exclusively within multi-die IC 100.

In one or more embodiments, including cases where received configuration data includes segments for a second multi-die IC, master die 105 can be configured to pass configuration data for all dies, with the exception of the segment for master die 105, through other dies of multi-die IC 100. Thus, in this case, configuration data is passed to slave die 110, inclusive of any segments to be provided as output from master die output port 520 via signal 525 to another IC for configuration.

Slave die 110 can be configured to pass, or output, unused segments, as determined by the configuration controller within slave die 110, through output port 605. The data passed from slave die 110 through signal 610 effectively loops back to master die 105 and can be received by input port 615. Master die 105 and, more specifically, e.g., the configuration controller within master die 105, can forward the configuration data received through input port 615 to master die configuration output port 520 as shown. In the example illustrated in FIG. 5, in order to use identical dies to implement multi-die IC 100, the output port of die 110, which is not illustrated in FIG. 5, can be left floating or tied to ground but not used.

In this example, output port 605 can be coupled to input port 615 to achieve better package migration. The loop back connection illustrated effectively causes configuration data to be serially propagated through dies in a different manner than illustrated with reference to FIG. 5. For example, a segment of configuration data for a slave die of an additional IC coupled to multi-die IC 100 via signal 525 will travel through each die of multi-die IC 100 and each die within the additional multi-die IC within which the slave die is disposed. In the arrangement illustrated in FIG. 5, such a segment bypasses slave die 110 of multi-die IC 100.

Referring again to FIG. 6, in one or more embodiments, signal 610 can be implemented in the form of a dedicated loop back signal that traverses through the interposer and that is exclusive of configuration bus 160. In one or more other embodiments, signal 610 can be passed through configuration bus 160. For example, output port 605 can be coupled to configuration bus 160. Slave die 110, in order to send data to master die 105, can take control of configuration bus 160 via signal 535 and notify master die 105 of the coming data via signal 545.

Figure 7:
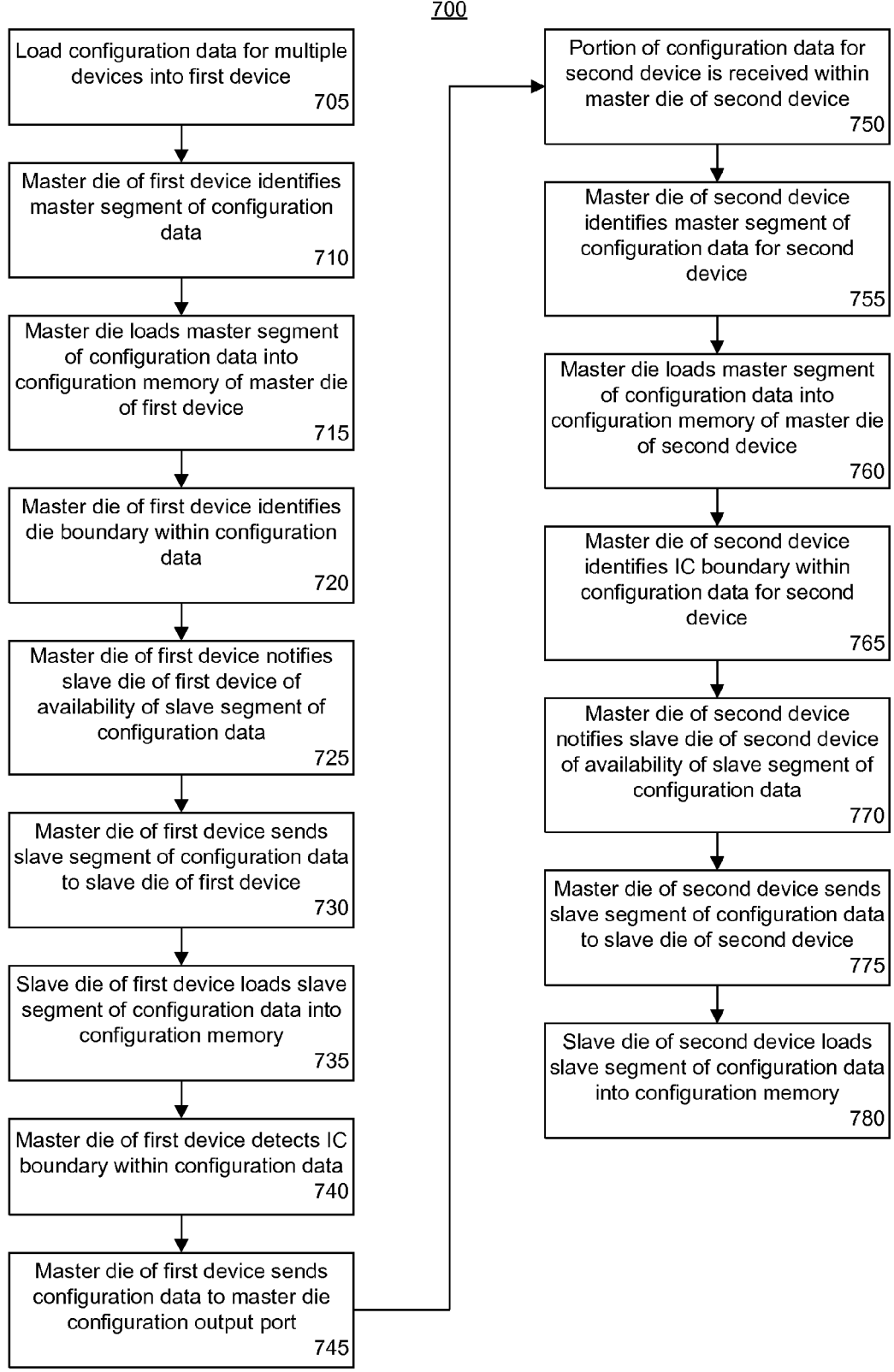
FIG. 7 is a first flow chart illustrating a method of loading configuration data within a system including a plurality of multi-die ICs in accordance with one or more other embodiments disclosed within this specification.

FIG. 7 is a flow chart illustrating a method 700 of loading configuration data within a system including a plurality of multi-die ICs in accordance with one or more embodiments disclosed within this specification. For ease of description and clarity, a multi-die IC is referred to as a "device" within the description of FIG. 7.

Beginning in step 705, configuration data for multiple devices can be loaded into a first device. The configuration data can include a plurality of encapsulated segments as described within this specification. In step 710, the master die of the first device can identify the master segment of the configuration data for the first device. In step 715, the master die can load the master segment of the configuration data for the first device into the configuration memory of the master die of the first device.

In step 720, the master die of the first device can identify or detect the die boundary within the configuration data. As noted, the die boundary can be included in the first portion of configuration data as described with reference to FIG. 4. It should be appreciated that, in one or more embodiments, the die boundary relating to the first device is the first die boundary specified in the configuration data when traversing the configuration data from beginning to end.

In step 725, the master die of the first device can notify the slave die of the first device of the availability of a slave segment of configuration data to be loaded. For example, as noted, the master die can pass a token to the slave die of the first device. In step 730, the master die of the first device can send the slave segment of configuration data to the slave die of the first device. In step 735, the slave die, e.g., the configuration controller, can load the slave segment of the configuration data into configuration memory of the slave die of the first device.

In step 740, the master die of the first device can identify or detect the IC boundary within the configuration data. In identifying the die boundary, the master die of the first device distinguishes between, and identifies, the first portion of the configuration data for the first device and the second portion of configuration data for the second device. Accordingly, in step 745, the master die can send the second portion of configuration data, e.g., the portion of configuration data for programming each die of a second device, to the master die configuration output port. For example, the second portion of configuration data can be the entirety of the configuration data following the IC boundary or can be an amount of configuration data following the IC boundary that is equal to an amount, or length, of configuration data specified by the IC boundary.

In step 750, the portion of configuration data for the second device is received within the master die of the second device. In step 755, the master die of the second device can identify the master segment of the configuration data for the second device. In step 760, the master die of the second device, e.g., the configuration controller, can load the master segment of configuration data for the second device into configuration memory of the master die of the second device.

In step 765, the master die of the second device can identify, or detect, the die boundary within the configuration data for the second device. In step 770, the master die of the second device can notify the slave die of the second device of the availability of slave segment data. In step 775, the master die of the second device can send the slave segment of the configuration data for the second device to the slave die of the second device. In step 780, the slave die of the second device can load the received slave segment into configuration memory within the slave die of the second device.

Figure 8:
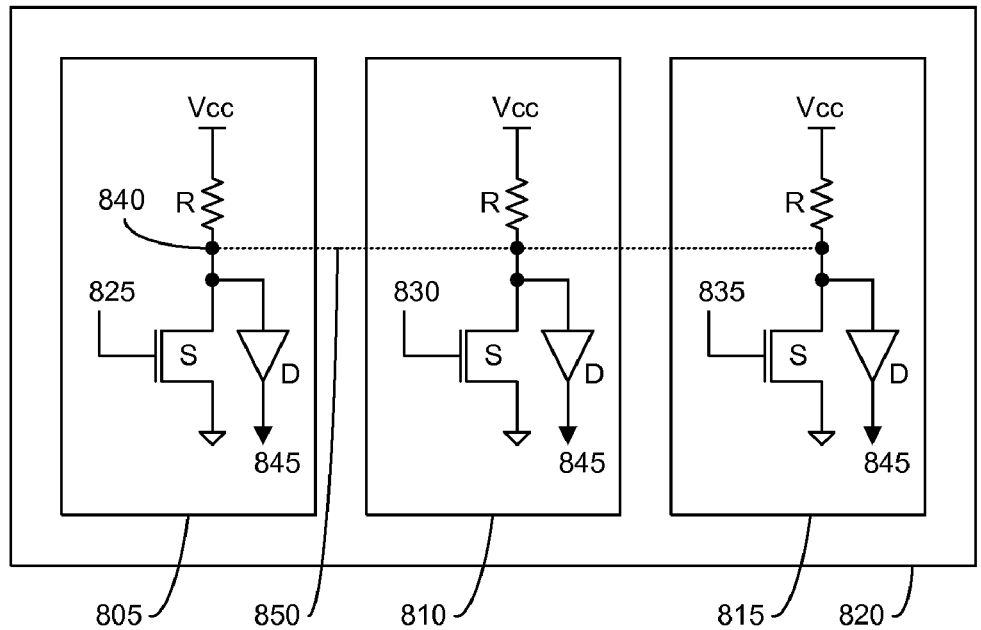
FIG. 8 is a fifth block diagram illustrating a multi-die IC configured in accordance with one or more other embodiments disclosed within this specification.

FIG. 8 is a fifth block diagram illustrating a multi-die IC 800 configured in accordance with one or more other embodiments disclosed within this specification. Multi-die IC 800 can be implemented as described within this specification. Multi-die IC 800 further can include one or more global signals that enforce uniformity of operating state across each die of multi-die IC 800.

Multi-die IC 800 can include dies 805, 810, and 815 each being located on an interposer 820 as described. Each of dies 805, 810, and 815 can include a circuit structure including a pull-up resistor "R" coupled to a voltage source "Vcc" at a first node, and a switch "S", such as a transistor, at the second node of the pull-up resistor. Control signals 825, 830, and 835 can be provided to the gate of the transistor switches "S" within each of dies 805, 810, and 815 respectively.

Each of the circuit structures can be coupled together at node 840 via one or more inter-die wires 850. Thus, responsive to any of control signals 825, 830, or 835 being asserted, e.g., transitioning to a logic high, the switch "S" closes and pulls the voltage at node 840 in each of dies 805, 810, and 815 to ground. Responsive to each of control signals 825, 830, or 835 being de-asserted, e.g., transitioning to a logic low, the switch "S" in that die opens, thereby pulling the voltage at node 840 in each of dies 805, 810, and 815 to a logic high, e.g., Vcc. In other words, each of dies 805-815, via signals 825-835 respectively, can pull the voltage at node 840 to ground. For the voltage at node 840 to go high, each of control signals 825-835 must be de-asserted concurrently.

Node 840, within each of dies 805, 810, and 815, can be coupled to a driver circuit "D." Driver circuit "D" can output a global signal 845 that changes or transitions based upon the state of node 840. For example, global signal 845 can transition high or low responsive to node 840 transitioning high or low respectively. Alternatively, driver circuit "D" can be an inverting circuit so that the global signal 845 output from each driver circuit "D" transitions opposite the voltage potential at node 840. In either case, the state of node 840 within any one of dies 805, 810, or 815 determines the state of global signal 845. Global signal 845, being the same within each of dies 805, 810, and 815, can be used to enforce a same or uniform operating state within each of dies 805-815.

For example, in one or more embodiments, any one of dies 805-815 can assert control signal 825-835 respectively. Assertion of any one of control signals 825-835 can cause global signal 845 to transition high or low depending upon the particular implementation used as described within this specification. In illustration, within die 805, a control circuit can be configured to detect a particular condition, e.g., one or more signals or signal combinations, within die 805. Responsive to detecting the condition, the control circuit can assert control signal 825. A similar controller can be placed within each of dies 810 and 815 to selectively assert control signals 830 and 835 respectively.

Referring again to die 805, another circuit block can be coupled to global signal 845. The circuit block coupled to global signal 845 within die 805 can be configured to implement a selected operating state responsive to global signal 845. The selected operating state, when implemented or invoked, can cause or invoke particular actions within die 805. A similar, or same, circuit block can be coupled to global signal 845 within dies 810 and 815 to initiate the same operating state within dies 810 and 815.

In one or more other embodiments, each of dies 805-815 can emerge or exit from the operating state triggered by global signal 845 when each of control signals 825-835 is de-asserted. For example, the control circuitry within die 805 can detect or determine that die 805 can exit from the initiated operating state. The control circuitry can de-assert control signal 825. Only when the control circuitry within each of dies 810 and 815 also determine that dies 810 and 815 can exit the initiated operating state are control signals 830-835 de-asserted so that global signal 845 again transitions. The circuit blocks coupled to global signal 845 within each of dies 805-815 only cause each of dies 805-815 to exit the operating state responsive to the transition of global signal 845 described, e.g., when each of control signals 825-835 is de-asserted.

The circuit structures illustrated in FIG. 8 are shown for purposes of illustration only and are not intended to limit the manner in which global signals are implemented across dies of a multi-die IC. In one or more other embodiments, for example, a resistor is not needed within each die as illustrated in FIG. 8, but rather can be included within fewer than all dies, e.g., within only one or two using substantially the same configuration shown in FIG. 8 for those dies with resistors. Global signals can be implemented for a variety of purposes relating to initiating a same or uniform operating state within each die concurrently and/or exiting from that operating state concurrently across each die in a coordinated manner. Further, the circuitry illustrated within each of dies 805, 810, and 815 implements a single global signal. Including multiple global signals within a multi-die IC requires multiple instances of the circuits illustrated.

Figure 9:
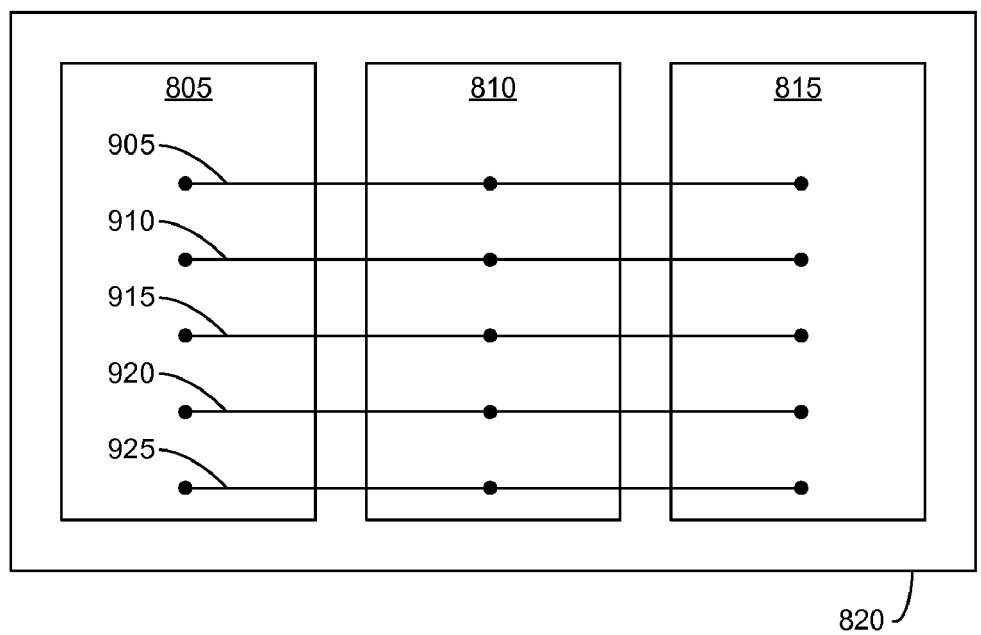
FIG. 9 is a sixth block diagram illustrating a multi-die IC configured in accordance with one or more other embodiments disclosed within this specification.

FIG. 9 is a sixth block diagram illustrating a multi-die IC configured in accordance with one or more other embodiments disclosed within this specification. FIG. 9 illustrates multiple examples of global signals that can be implemented within multi-die IC 800. In general, multi-die IC 800 can utilize one or more of five different global signals. Thus, one instance of the circuitry described for each die with reference to FIG. 8 can be included in each die for each global signal implemented. It should be appreciated that whether each global signal described is included within a given multi-die IC depends upon whether that multi-die IC implements the functionality that is to be reconciled and made uniform across dies.

It should be appreciated that the use of global signals as described within this specification can be particularly useful when the dies are programmable ICs. In other types of multi-die ICs that are not programmable, for example, the interface between dies can be highly specified and unchanging, e.g., static. Since each of dies 805-815 can be effectively a single-die programmable IC, e.g., an FPGA, the use of global signals to ensure uniform operating conditions across dies can be useful, particularly as the interface between each of dies 805-815 can change with the particular configuration data loaded into multi-die 800. For example, though configuration bus 160 can remain static and dedicated for a particular purpose, other ones of the inter-die wires can be selectively coupled to different internal circuit blocks within each of dies 805-815 that change based upon the particular configuration data that is loaded into each respective one of dies 805-815.

One global signal that can be implemented is a global high signal 905. In general, when global high signal 905 is asserted, each of dies 805-815 can be placed in a global high operating state. Within the global high operating state, selected signals in each of dies 805-815 can be held in a known or predetermined state, e.g., high. For example, when resetting multi-die IC 800, configuring multi-die IC 800, or the like, one or more signals within dies 805, 810, and 815 can be in unknown states or placed in contention with one another. One example of a situation where signals can be in contention can include an inter-die signal that is being driven low on one end, e.g., in one die, and being driven high at the other end, e.g., in another die. In another example, the directionality of an inter-die signal can change in consequence of multi-die IC 800 being reset or loaded with new configuration data. Thus, responsive to any one of dies 805-815 triggering global high signal 905, each other die detects the state of global high signal 905 within that die and initiates the global high operating state concurrently in a coordinated manner. Using global high signal 905, such signals can be maintained in a predetermined and known state so long as global high signal 905 is asserted across each of dies 805-815.

Another global signal that can be implemented is a global power down signal 910. Global power down signal 910 can be used to ensure that when one of dies 805-815 is powered down, or enters a power down operating state, each other one of dies 805-815 is powered down also. In one or more embodiments, any one of dies 805-815 can trigger global power down signal 910. Responsive to any one of dies 805-815 triggering global power down signal 910, each other die detects the state of global power down signal 910 within that die and initiates power down causing each of dies 805-815 to power down concurrently in a coordinated manner. Global power down signal 910 prevents one of dies 805-815 from being effectively turned off without turning off each other die of multi-die IC 800. In this regard, global power down signal 910 can be used as a fail-safe that can be triggered by any die.

In one or more other embodiments, global power down signal 910 can be initiated upon request of a user, e.g., a circuit design instantiated within multi-die IC 800. In that case, a request can be submitted to the master die, e.g., die 805. For example, authority to trigger global power down signal 910 responsive to a user request can be reserved exclusively for the master die. In any case, once the master die triggers global power down signal 910, each other die in multi-die IC 800 can be powered down responsive to global power down signal 910.

Another global signal that can be implemented is a global configuration reset signal 915. Global configuration reset signal 915 can be used to implement a "hard" system reset type of operating state within multi-die IC 800. A hard system reset refers to a situation in which the configuration memory within each die is erased and all configurable circuitry within each of dies 805-815 is reset. Thus, responsive to one of dies 805-815 triggering global configuration reset signal 915, each of dies 805-815 can initiate the hard system reset concurrently in a coordinated manner.

A hard system reset can occur in a variety of different situations. For example, each die can be configured to determine whether a valid power source is available. Each die can determine whether the voltage of the power source is within a defined voltage range, e.g., from approximately 0.8 volt to 1.0 volt. Despite each of dies 805-815 being coupled to a same voltage source, process variations within each die can cause die 805, for example, to initiate a hard system reset when the voltage of the power source is determined to be well within the defined range in dies 810 and 815. For example, due to process variations, die 805 can initiate a hard system reset when the power supply is determined to be providing 0.82 volt, which is within the range of dies 810 and 815. Without enforcing uniformity of hard system reset across dies utilizing global configuration reset signal 915, die 805 begins a hard system reset, while dies 810 and 815 do not. Thus, global configuration reset signal 915 can be utilized as a fail-safe to ensure uniform, e.g., concurrent, implementation of hard reset across each of dies 805-815.

Another global signal that can be implemented is a global internal programming signal 920. Global internal programming signal 920 can be used to enforce uniform implementation of a "soft" system reset type of operating state across each of dies 805-815. A soft system reset can also be referred to as a "warm boot." A soft system reset, for example, can reset some or most portions of each of dies 805-815, but not all portions as is the case with a hard system reset. For example, different monitoring and/or watchdog circuits are not reset during a soft system reset.

In one example, a soft system reset can be initiated by the circuit design instantiated within multi-die IC 800. The circuit design, by initiating soft system reset, initiates the loading of different configuration data. Implementation of a soft system reset can erase configuration memory. Multi-die IC 800 awakens from the soft system reset knowing, for example, where to obtain the new configuration data that is to be loaded. Thus, in response to assertion of global internal programming signal 920, each of dies 805-815 undergoes a soft system reset concurrently and in a coordinated manner, thereby preparing each of dies 805-815 for receiving and loading new configuration data.

Another global signal that can be implemented is a global fall-back signal 925. Global fall-back signal 925 can be used to enforce uniform implementation of a fall-back type of operating state. "Fall back" refers to a form of soft system reset. Rather than awakening from the soft system reset and obtaining a user-specified circuit design from a known location, the fall back state causes multi-die IC 800 to load a default or safe configuration (configuration data) for multi-die IC 800. Thus, in response to assertion of global fall-back signal 925, each of dies 805-815 can implement fall-back concurrently and in a coordinated manner. Accordingly, the configuration memory in each of dies 805-815 is erased in preparation for receiving the safe configuration to be loaded.

Various types of global signals have been described to enforce uniform implementation of operating state across each of dies 805-815. Responsive to the global signals, each die can implement the enumerated operating state substantially simultaneously. Similarly, each of dies 805-815 can exit the enumerated operating state substantially simultaneously and in a coordinated manner in accordance with the relevant global signal transitioning as described with reference to FIG. 8.

Figure 10:
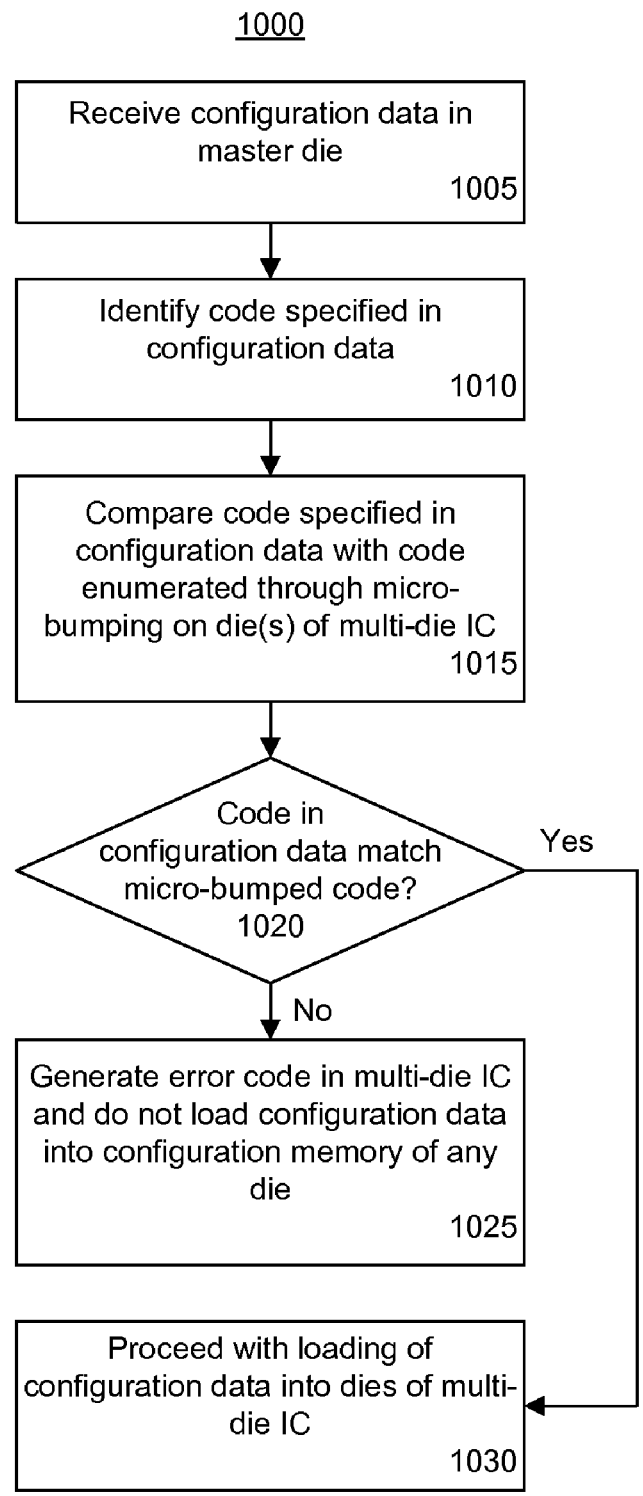
FIG. 10 is a second flow chart illustrating a method of loading configuration data into a multi-die IC in accordance with one or more other embodiments disclosed within this specification.

FIG. 10 is a second flow chart illustrating a method 1000 of loading configuration data into a multi-die IC in accordance with one or more other embodiments disclosed within this specification. Method 1000 can be implemented by a multi-die IC as described within this specification. Beginning in step 1005, configuration data can be received within the multi-die IC. More particularly, configuration data can be received by the configuration controller of the master die of the multi-die IC.

In step 1010, the configuration controller can identify the code specified within the configuration data. The code, for example, can specify a variety of different information including, but not limited to, a version number of the target IC, the foundry that produced the target IC, a product family of the target IC, a sub-family or sub-product line of the target IC, the number of dies within the target IC, a designation of which die is master and which die is a slave, as well as the company that manufactures the target IC. The phrase "target IC" refers to the multi-die IC within which the configuration data is intended to be loaded.

In step 1015, the configuration controller can compare the code specified within the configuration data with the code specified through micro-bumping. Any of the various portions of the code described with reference to step 1010 can be enumerated as part of the code micro-bumped within the multi-die IC that is compared with the code identified from the configuration data.

It should be appreciated, that one or more of the portions of the code imprinted within the multi-die IC can be specified by hard circuitry, e.g., metal, that permanently sets the micro-bump or node to high or low. For example, permanent techniques can be used to specify portions of the code within the multi-die IC that do not change or do not change frequently, e.g., version, foundry, family, sub-family, company, or the like. Those portions that can change, e.g., the number of dies and the designation of dies as master or slave, can be specified through the dynamic techniques described within this specification where the micro-bumps are left floating or tied to ground during the packaging process.

In step 1020, the configuration controller can determine whether the code from the configuration data matches the code imprinted in the multi-die IC, e.g., the micro-bumped code. When the code from the configuration data matches the micro-bumped code of the multi-die IC, method 1000 can proceed to step 1030 where the configuration data can be loaded into the multi-die IC as described within this specification. When the code from the configuration data does not match the micro-bumped code of the multi-die IC, method 1000 can continue to step 1025. In step 1025, an error code can be generated. Further, the configuration data is not loaded into configuration memory of any die of the multi-die IC. A mismatch can mean that the configuration data is for a different type of IC than the multi-die IC into which the configuration data has been loaded, e.g., one with a different number of dies.

The flowcharts in the figures illustrate the architecture, functionality, and operation of possible implementations of systems and methods according to one or more embodiments disclosed within this specification. In some alternative implementations, the functions noted in the blocks can occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of configuring an integrated circuit (IC), the method comprising:
   receiving configuration data within a master die of a first IC, wherein the first IC comprises the master die and a slave die;
   determining a master segment and a slave segment of the configuration data, wherein the master segment specifies a master die circuit design to be implemented within the master die and the slave segment specifies a slave die circuit design to be implemented within the slave die;
   distributing the slave segment of the configuration data to the slave die of the first IC,
   determining, within the master die, whether configuration data comprises a segment of configuration data for a second IC; and
   responsive to determining that the configuration data comprises a segment of configuration data for the second IC, sending the segment of the configuration data to the second IC.

2. The method of claim 1, further comprising:
   implementing the master die circuit design within the master die by loading the master segment of the configuration data into configuration memory of the master die; and
   implementing the slave die circuit design within the slave die by loading the slave segment of the configuration data into configuration memory of the slave die.

3. The method of claim 1, further comprising:
   sending the segment of configuration data for the second IC from the master die to the slave die, wherein the slave die sends the segment of configuration data for the second IC back to the master die prior to sending the segment of configuration data for the second IC to the configuration data output of the master die.

4. The method of claim 1, further comprising:
   sending the segment of configuration data for the second IC directly from the master die of the first IC to the configuration data output of the master die without first sending the segment of configuration data for the second IC to any other die of the first IC.

5. The method of claim 1, wherein distributing the slave segment further comprises:
   sending a notification from the master die to the slave die that a segment of configuration data is available; and
   sending the slave segment to the slave die through a configuration bus within the first IC.

6. The method of claim 1, further comprising:

responsive to detecting a selected operating state within either the master die or the slave die, initiating the same operating state within the other one of the master die or the slave die.

7. The method of claim 1, further comprising:

coupling the master die of the first IC to a global signal; and coupling the slave die of the first IC to the global signal, wherein the master die of the first IC and the slave die of the first IC implement a same operating state concurrently in response to the global signal.

8. An integrated circuit (IC) comprising:

an interposer comprising a configuration bus;

a first die on a surface of the interposer;

a second die on the surface of the interposer, wherein the first die and the second die are coupled by the configuration bus, wherein the first die is configured, responsive to receiving configuration data, to determine a first segment and a second segment of the configuration data and distribute the second segment of the configuration data to the second die through the configuration bus, wherein the first die is configured to determine whether the configuration data comprises a segment of configuration data for an additional IC, and wherein the first die comprises a configuration data output coupled to an output of the IC, and responsive to determining that the configuration data comprises a segment of configuration data for the additional IC, the first die is configured to send the segment of configuration data for the additional IC through the first die configuration data output.

9. The IC of claim 8, wherein the interposer further comprises configurable and active circuitry, wherein the active circuitry is coupled to the configuration bus and implements a circuit design responsive to receiving configuration data through the configuration bus.

10. The IC of claim 8, further comprising:

a loop back connection within the interposer that couples the second die and the first die, wherein the loop back connection is configured to send configuration data from the second die back to the first die, wherein the first die is configured to send the segment of configuration data for the additional IC from the first die to the second die, wherein the second die sends the segment of configuration data for the additional IC back to the first die through the loop back connection prior to the first die sending the segment of configuration data for the additional IC through the first die configuration output port.

11. The IC of claim 10, wherein the second die does not include a configuration output port that is coupled to an output of the IC.

12. The IC of claim 8, wherein the first die is configured to send the segment of configuration data for the additional IC through the first die configuration port without first sending the segment of configuration data for the additional IC to any other die of the IC.

13. The IC of claim 8, wherein responsive to detecting a selected operating state within either the first die or the second die, the same operating state is implemented within the other one of the first die or the second die.

14. The IC of claim 8, wherein the interposer carries a global signal, and wherein the first die is coupled to the global signal, and the second die is also coupled to the global signal, and wherein the first die and the second die implement a same operating state concurrently in response to the global signal.

\* \* \* \* \*

(12) INTER PARTES REVIEW CERTIFICATE (10th)
United States Patent
Lu et al.

(10) Number: US 8,058,897 K1
(45) Certificate Issued: Jul. 10, 2014

(54) CONFIGURATION OF A MULTI-DIE INTEGRATED CIRCUIT

(75) Inventors: Weiguang Lu; Eric E. Edwards; Paul-Hugo Lamarche; Brian C. Gaide; Joe Eddie Leyba, II; Steven P. Young

(73) Assignee: Xilinx, Inc.

Trial Number:

IPR2012-00020 filed Sep. 17, 2012

Petitioner: Intellectual Ventures Management, LLC

Patent Owner: Xilinx, Inc.

Inter Partes Review Certificate for:

Patent No.: 8,058,897
Issued: Nov. 15, 2011
Appl. No.: 12/825,286
Filed: Jun. 28, 2010

The results of IPR2012-00020 are reflected in this inter partes review certificate under 35 U.S.C. 318(b).

INTER PARTES REVIEW CERTIFICATE
U.S. Patent 8,058,897 K1
Trial No. IPR2012-00020
Certificate Issued Jul. 10, 2014

AS A RESULT OF THE INTER PARTES REVIEW PROCEEDING, IT HAS BEEN DETERMINED THAT:

Claims 1-9 and 12-14 are cancelled.

* * * * *